United States Patent
Favaron

(10) Patent No.: US 9,890,858 B2
(45) Date of Patent: Feb. 13, 2018

(54) SLIDING ELEMENT AND INTERNAL COMBUSTION ENGINE

(71) Applicants: Mahle Metal Leve S/A, Jundiai - Sp (BR); Mahle International GmbH, Stuttgart (DE)

(72) Inventor: Rodrigo Favaron, Sao Paulo (BR)

(73) Assignees: Mahle Metal Leve S/A (BR); Mahle International GmbH (DE)

( * ) Notice: Subject to any disclaimer, the term of this patent is extended or adjusted under 35 U.S.C. 154(b) by 456 days.

(21) Appl. No.: 14/411,849

(22) PCT Filed: Jun. 28, 2013

(86) PCT No.: PCT/BR2013/000232
§ 371 (c)(1),
(2) Date: Dec. 29, 2014

(87) PCT Pub. No.: WO2014/000076
PCT Pub. Date: Jan. 3, 2014

(65) Prior Publication Data
US 2015/0167845 A1   Jun. 18, 2015

(30) Foreign Application Priority Data

Jun. 29, 2012   (BR) .............................. 102012016283

(51) Int. Cl.
| | |
|---|---|
| *F16C 33/20* | (2006.01) |
| *F16J 9/26* | (2006.01) |
| *B32B 23/08* | (2006.01) |
| *B22D 25/00* | (2006.01) |
| *C23C 16/02* | (2006.01) |
| *C23C 16/30* | (2006.01) |

(52) U.S. Cl.
CPC ............ *F16J 9/26* (2013.01); *C23C 16/0281* (2013.01); *C23C 16/30* (2013.01)

(58) Field of Classification Search
CPC ........ F16J 9/26; F16J 9/061; F16J 9/12; F16J 15/441; C23C 16/30
USPC .......... 508/108; 428/555, 610, 527; 277/442
See application file for complete search history.

(56) References Cited

U.S. PATENT DOCUMENTS

| | | |
|---|---|---|
| 5,024,901 A | 6/1991 | Garg et al. |
| 2004/0069141 A1 | 4/2004 | Herbst-Dederichs |

FOREIGN PATENT DOCUMENTS

| | | |
|---|---|---|
| DE | 10011917 A1 | 9/2001 |
| JP | 02089874 | 3/1990 |
| WO | WO-2008/098548 A1 | 8/2008 |

OTHER PUBLICATIONS

English abstract for DE10011917.
English abstract for JP02089874.

*Primary Examiner* — Vishal Vasisth
(74) *Attorney, Agent, or Firm* — Fishman Stewart PLLC

(57) ABSTRACT

A sliding element for an internal combustion engine may include a ferrous material base defining a plurality of surfaces. A binding nickel layer may be applied across all of the surfaces of the base. A deposited layer may be disposed on the binding layer. The deposited layer may include a metallic tungsten matrix and a tungsten carbide. The deposited layer may be provided with a thickness between 5 and 150 microns.

20 Claims, 4 Drawing Sheets

SLIDING ELEMENT AND INTERNAL COMBUSTION ENGINE

CROSS-REFERENCE TO RELATED APPLICATIONS

This application claims priority to Brazilian Patent Application No. 102012016283-0, filed Jun. 29, 2012, and International Patent Application No. PCT/BR2013/000232, filed Jun. 28, 2013, both of which are hereby incorporated by reference in their entirety.

TECHNICAL FIELD

The present invention relates to a sliding element for use on an internal combustion engine, which is provided with a sliding layer comprising a matrix of tungsten and tungsten carbides with a view to prolong the longevity of the sliding element by improving the fatigue strength and wear strength and, at the same time, to prevent wear of the engine components that interact with said sliding element.

BACKGROUND

Taking into account the growing demands of the automobile industry, new requirements have emerged, which are reflected directly in greater stress on the components of internal combustion engines. So, the present-day engine components, which were not designed for such requirements, undergo early wear. Some of the parts that naturally undergo this effect are the sliding elements, particularly bearings and piston rings.

Numberless developments have been made for the purpose of improving the fatigue strength and wear strength of the components of an internal combustion engine. However, the increase of work pressures on internal combustion engines and the growing friction intensity and contact between the engine components make it difficult to succeed in such attempts, because this lead one of the sliding elements, or the other engine components to wear.

It should also be noted that the future does not hold in store any simplicity for this field of activity; suffice it to observe that more powerful engines are required, which can reach higher and more efficient rotational speed, with lower consumption and high load capacity. All these factors affect the performance of the engine in the long run, impairing the engine operation, or even causing it to fail.

Naturally, in the face of the new requirements, new materials have to be developed, since the known ones are the same that limit the performance of internal combustion engines of today. Some of the most important components to achieve a better performance of an engine are the sliding elements, such as pistons, bearings, etc. Due to the innovations of sliding elements, such as higher hardness, higher fatigue strength and wear strength and, as a result, longer useful life, the automobile industry has kept up with the development of more and more efficient, powerful and durable engines in the face of the high load to which they are subjected.

One understands that the harder the sliding element the less it will wear; but the harder the sliding element the more wear will occur on the softer engine components with which it interacts. Moreover, it is known that the harder the sliding element the more fragile it becomes and the more internal tensions are generated upon manufacture, which leads chiefly to an increase in the probability of there being delamination of the sliding element, detachment of the harder layer that receives the component or even the break, rupture of the component.

In this regard, the prior art has been trying to reach a balance of having a sliding element with sufficiently high hardness, so as not to wear easily in contact with other engine components, but also sufficiently non-aggressive with respect to the other engine components, so as not to cause wear on the other engine components, and sufficiently tough to prevent de-lamination of the sliding element and to prolong the useful life of an engine in general. As can be seen, the equation is far from being easy.

At last, the present invention discloses a sliding element having higher hardness than the prior-art sliding elements, but, on the other hand, it does not cause wear on the other engine components with which the element interacts constantly in operation of the engine.

Finally, one presents a sliding element of high hardness, which undergoes less wear under high load, which does not undergo delamination and also does not cause wear on the other engine components.

Notwithstanding the possible problems identified above, such as wear on other engine components or internal stress in the engine due to the use of a sliding element of high hardness, patent application WO2008098548 and patent DE 10011917 reveal a high demand for sliding elements with higher hardness for use on internal combustion engines.

Patent application WO2008098548 describes a piston ring provided with a sliding layer, which gradually diminishes and is deposited onto at least one face of the piston ring by physical vapor deposition (PVD). However, sliding elements coated by PVD are more susceptible to delamination when compared with sliding elements provided with layers deposited by other processes. So, this technology has serious problems right at the start.

Patent DE 10011917 discloses a piston ring comprising a titanium-nitride coating layer with hardness of about 2200 HV to 2500 HV, by PVD or CVD onto the sliding surface of the piston ring, having a thickness ranging from 5 to 20 microns. The technology disclosed in this document has a serious drawback, which derives from the reduced thickness of the deposited layer, resulting in a reduced useful life of the component, that is, exactly that which one desires to avoid. In the same way, the hardness is excessively high to the point of scratching the cylinder sliding surface.

Thus, it is necessary to achieve a solution that guarantees the requirement of durability, preventing the risk of wear on the components with which the sliding element interacts and also preventing delamination, which naturally tends to increase with the increase in the hardness of the coating layer.

SUMMARY

Therefore, it is an objective of the present invention to provide a sliding element for use on internal combustion engines, capable of harmonizing different characteristics responsible for better resistance to wear, for both the sliding element and the surfaces of the engine components with which such a sliding element interacts.

It is also an objective of the invention to provide a sliding element for use on internal combustion engines, comprising a layer provided with a tungsten matrix and tungsten carbides, wherein the ferrous base material is coated with said tungsten matrix and tungsten carbides, wherein said layer may be associated to the ferrous base by means of a binding layer of nickel. It is a further objective of the present invention to provide a sliding element for use on internal combustion engines, comprising a layer provided with a tungsten matrix and a tungsten carbides, said layer being applied by chemical vapor deposition (CVD).

Finally, it is another objective of the present invention to provide an engine having the above-mentioned sliding element.

The objectives of the present invention are achieved by means of a sliding element for internal combustion engines, the sliding element being provided with a ferrous base material, on which a layer provided with a tungsten matrix and tungsten carbides is applied by CVD simultaneously and uniformly, wherein the layer may be associated to the ferrous base by means of a binding nickel layer.

The sliding element of the present application, for internal combustion engines, may include, without limitation thereto, a bearing, a piston ring, an engine piston and other components of internal combustion engines that have sliding properties.

BRIEF DESCRIPTION OF THE DRAWINGS

The present invention will now be described in detail with reference to an example of embodiment represented in the drawings. The figures show.

DETAILED DESCRIPTION

Figure 1:
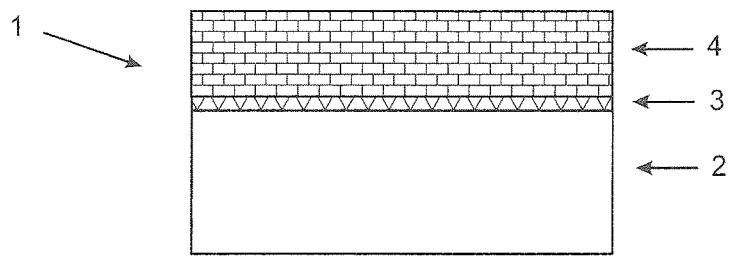
FIG. 1 is a representation of the layers of the sliding element of the present invention.
Figure 2:
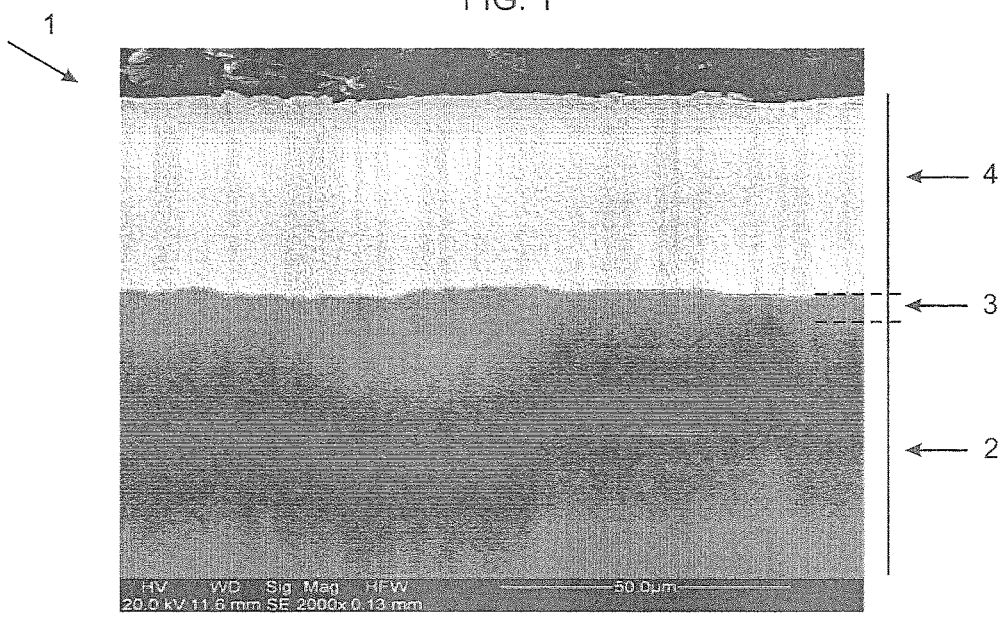
FIG. 2 is a photograph of the layers of the sliding element of the present invention.
Figure 3:
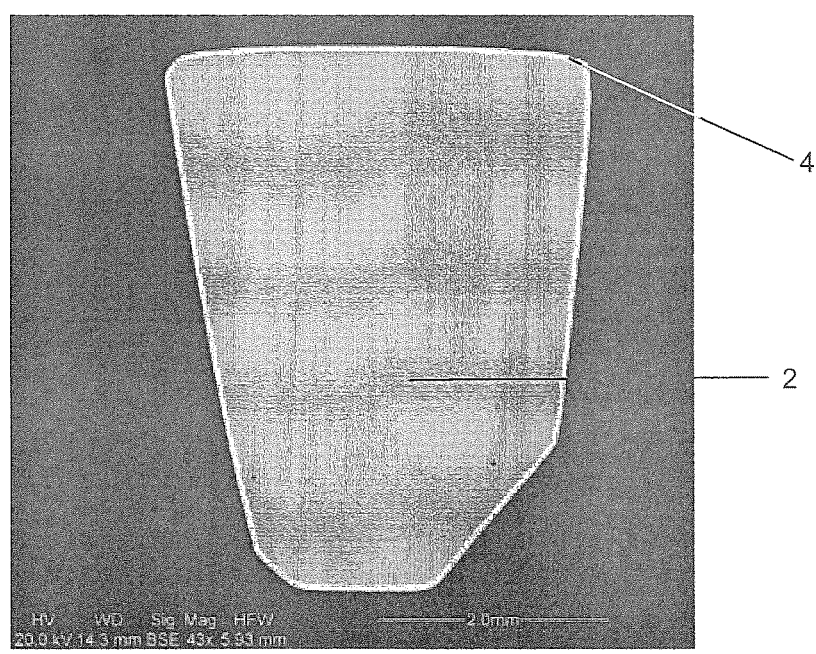
FIG. 3 is a photograph of the cross-section of the sliding element of the present invention.

FIGS. 1, 2 and 3 represent a cross-sectional view of the sliding element 1 of the present invention. Preferably, but not compulsorily the sliding element 1 of the present invention comprises a ferrous base material 2, onto which a layer 4 provided with a tungsten matrix and tungsten carbides is applied by CVD, wherein the layer 4 may be associated to the ferrous base 2 by means of a binding nickel layer 3 for the purpose of promoting better adhesion between the layer 4 and the ferrous base 2.

FIG. 3 shows that the thickness of the sliding element is uniform on all the surfaces of the sliding element. It should be noted that the uniform deposition of this layer onto the sliding element is achieved compulsorily by a CVD process. The CVD process has favorable conditions to the application of a layer onto sliding elements, so that all the surfaces of the elements will be exposed to the atmosphere of the oven where the CVD deposition takes place. Therefore, a coating of a sliding element on all the surfaces is carried out by CVD simultaneously and uniformly. Thus, as will be set forth hereinafter, in addition to the advantage indicated, the CVD proves to be superior in comparison with the PVD, the deposited layers of which are more susceptible to delamination.

Considering that the uniform and simultaneous application of the layer on all the surfaces of the sliding element is preferably, one may also applies the layer provided with a tungsten matrix and tungsten carbides only in specific regions of the sliding element. More specifically, the layer provided with a tungsten matrix and tungsten carbides may be applied either only on the sliding surface or on the sliding surface and on the top and bottom surfaces of the sliding element (adjacent surfaces). In the latter case, the layer deposited on the adjacent layers may further be provided of a smaller thickness than that of the layer applied onto the sliding surface, thus creating a thickness gradient on the sliding element.

With regard to the other particularities of the sliding element 1 of the present invention, it should be noted that the base material 2 comprises a ferrous alloy, preferably, but not compulsorily, of carbon steel, stainless steel or cast iron, wherein, for instance, a low-carbon or middle-carbon steel comprises a thickness ranging from 0.25 mm to 10 mm.

The binding layer 3, if any, comprises pure nickel, having, preferably, but not compulsorily, a thickness between 1 and 5 microns.

With regard to the layer 4 deposited by CVD, its composition is a tungsten metal matrix and tungsten carbides. More specifically, the matrix may comprise, in addition to the tungsten metal: WC tungsten carbides; subcarbide of W2C tungsten; subcarbide of W3C tungsten; subcarbide of W12C tungsten; or a mixture of these carbides.

It should be further noted that the layer 4 is provided with a thickness ranging from 5 to 150 microns, preferably from 5 to 60 microns. Moreover, the layer 4 has a hardness ranging from 1000 HV to 3500 HV, which varies according to the depth of the applied matrix. More specifically, the region of the surface of the deposited layer 4 (outermost region) of the sliding element has hardness ranging from 1500 HV to 3500 HV, and the portion of the deposited layer 4 beginning from the ferrous base (or binding layer 3) to the middle of the CVD-deposited layer has hardness lower than 1500 HV.

Figure 4:
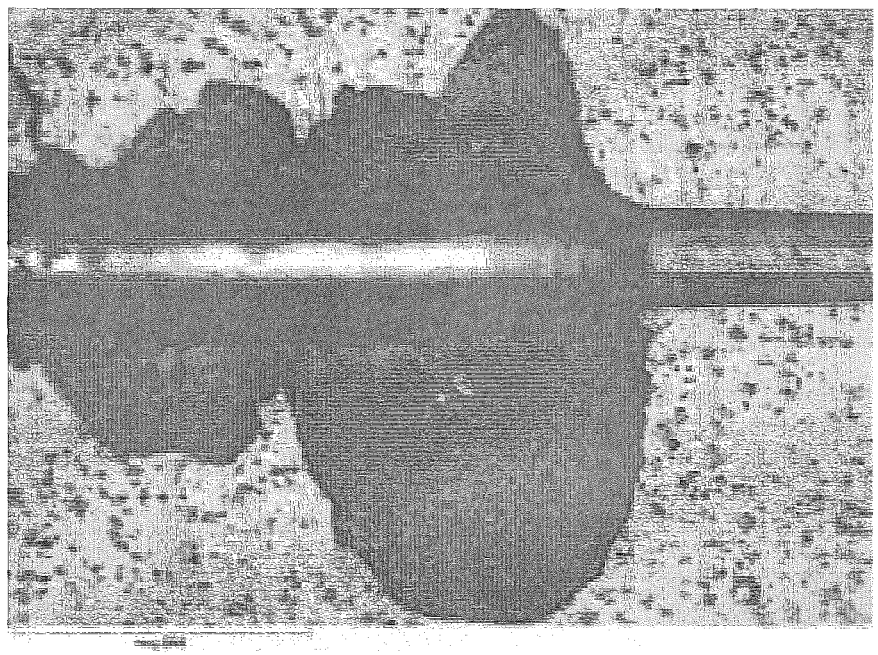
FIG. 4 is a photograph of a prior-art sliding element that has undergone delamination at 120 N after having been subjected to a scratching test.
Figure 5:
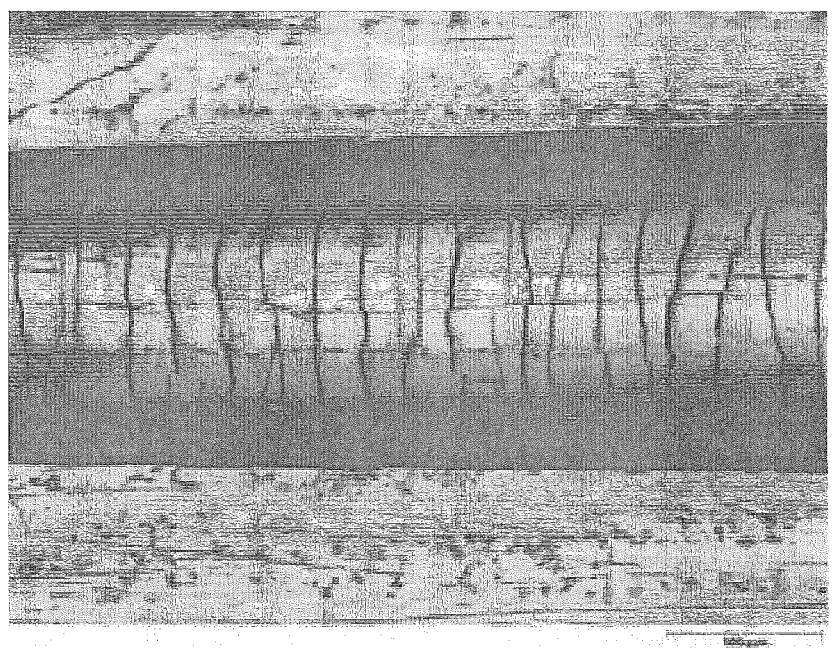
FIG. 5 is a photograph of a sliding element of the present invention that has undergone delamination at 180 N after having been subjected to a scratching test.

The set of FIGS. 4 and 5 shows the results of two sliding elements after the scratching test, one referring to the prior art that has under-gone a 120 N load until delamination took place, and the other representing the present invention and that has not undergone delamination when subjected to the maximum load of the equipment, which is of 180 N. The sliding element of the prior art represented by FIG. 4 is provided of a chrome nitride layer deposited by PVD. On the other hand, the sliding element of the present invention, represented by FIG. 5, is provided with tungsten matrix and tungsten carbide deposited by CVD. The layer of the sliding element that has undergone delamination (FIG. 4) was deposited by PVD. The layer of the sliding element that did not undergo delamination (FIG. 5), in turn, was deposited by CVD. The set of FIGS. 4 and 5 aids in demonstrating the importance of depositing the layer by CVD, in order to prevent possible delaminations of the layers deposited onto the sliding elements.

In addition to these benefits, the CVD-deposited layer also enables the elimination of heat treatments by nitridation which is necessary in the prior art, since a hard and wear-resistant layer is also required on the faces adjacent to the contact face, because in the prior art the wear-resistant material (PVD) is applied concomitantly only onto the outer face of the component, and a nitridation-hardening treatment is often required in these cases. It is known that this type of treatment makes the component fragile, chiefly in corner regions, where the higher stresses concentrate, and the cyclic stresses to which the components are subjected may lead to a fatigue fracture of the component.

As far as the present invention is concerned, since it makes use of a CVD process, and as mentioned before, all the component faces exposed to the oven atmosphere receive simultaneously the covering with the hardened material. It this case, those usually applied by nitridation-hardening process are not necessary, which imparts to the component not only wear-resistance advantages, but also strength advantages as compared with the prior art.

Figure 6:
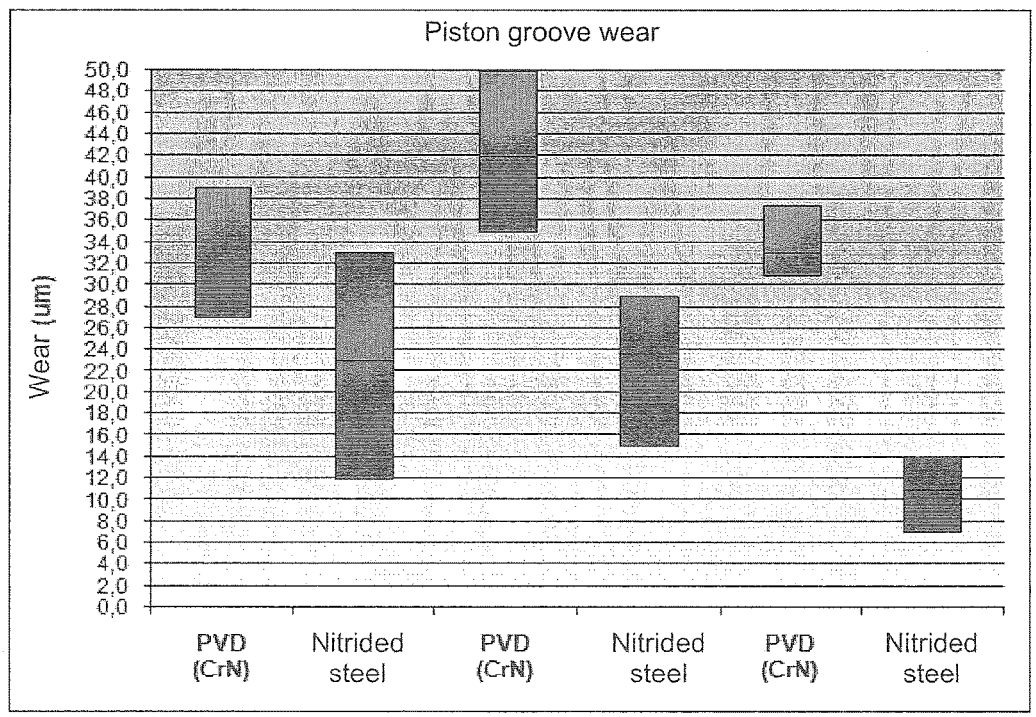
FIG. 6 shows comparative graphs of wear of a piston groove between two prior-art materials—PVD (CrN) X Nitrided Steel.
Figure 7:
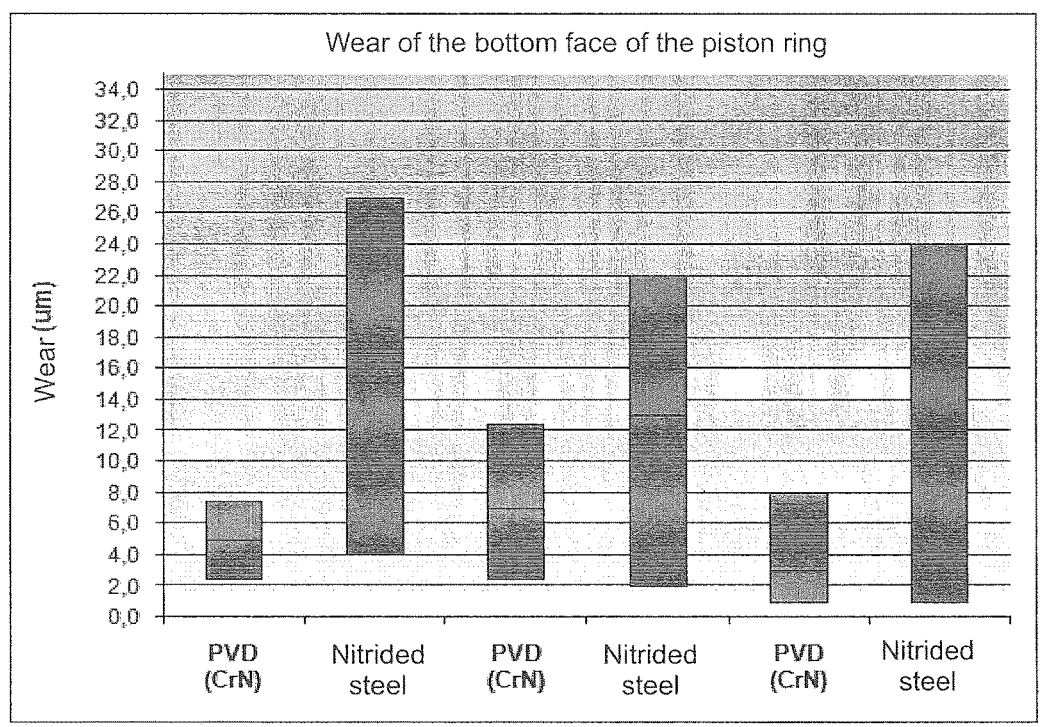
FIG. 7 shows comparative graphs of the wear bottom face of a piston ring between two prior-art materials PVC (CrN) X Nitrided Steel.
Figure 8:
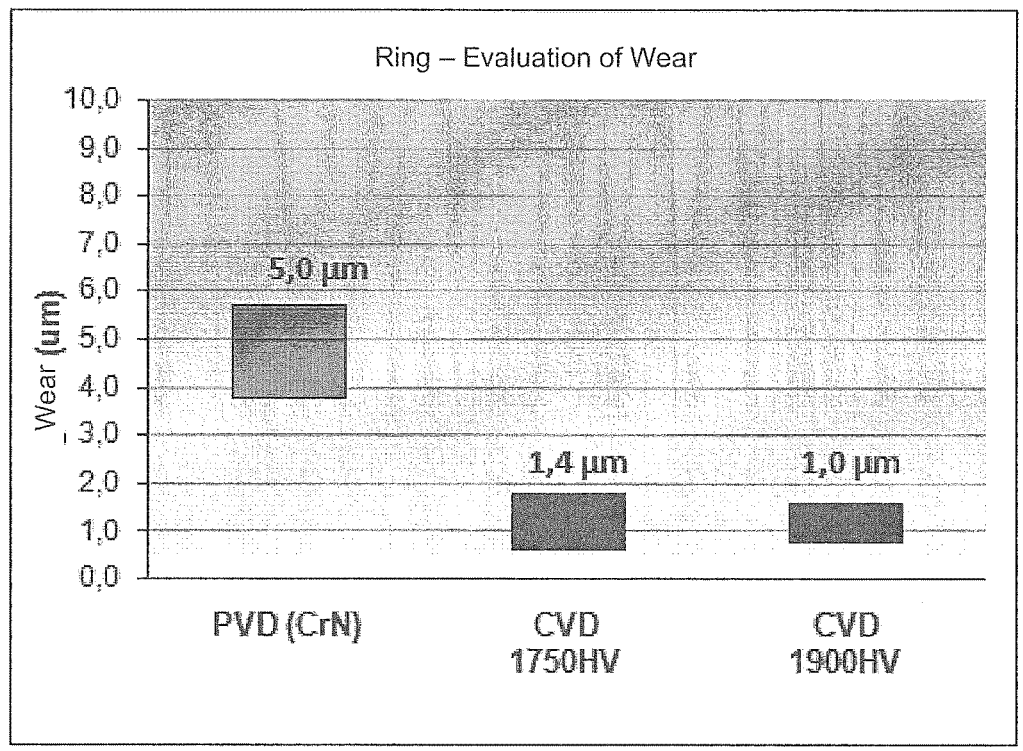
FIG. 8 is a graph showing that the sliding element of the present invention undergoes less wear than the sliding element of chrome nitride.
Figure 9:
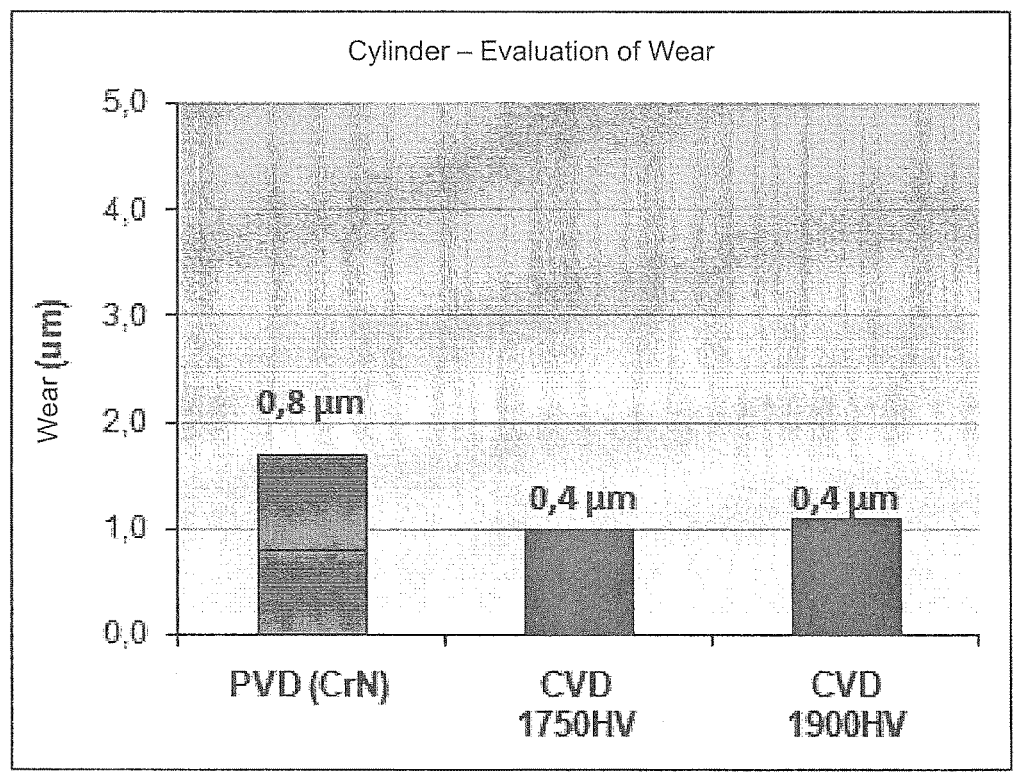
FIG. 9 is a graph showing that the sliding element of the present invention causes less wear to a component of internal combustion engines with which it interacts in comparison with a prior-art sliding element of chrome nitride.

The graphs of FIGS. 6 and 7 represent sliding elements that compose the prior art. They show the wear that they undergo, and the wear which sliding elements having high hardness cause on the surfaces of engine components with which they interact. More particularly, FIG. 6 shows a comparison of wear of the piston groove between two prior-art materials—PVD (CrN) X Nitrided Steel. On the other hand, FIG. 7 presents a comparison of the wear of the bottom face of a piston ring between two prior-art materials—PVD (CrN) X Nitrided Steel).

As can be seen in the graphs of FIGS. 6 and 7, for the example where there is a nitridation-hardened layer, both the sliding element and the component with which it interacts, in this case the piston grooves, have undergone wear on the order of 10 to 20 microns. Now, in comparison with the other prior-art example (PVD CrN), although the wear of the sliding element has been minimized to 5 microns at most, in the component that interacts, piston grooves, the wear was aggravated by 30 to 40 microns, which evidences the need to develop a material that raises the wear-resistance of the sliding element without damaging the other component that interacts.

Finally, an analysis of the graphs 8 and 9 in conjunction shows that the sliding elements of the present invention, of hardness ranging from 175 HV to 1900 HV, respectively, exhibit significantly higher wear-resistance when compared with the prior-art sliding element (a layer provided with chrome nidride, applied by PVD). It also shows that the sliding elements of the present invention manage to maximize their resistance to wear, without causing wear on the engine components with which the sliding elements interact, although they have higher hardness.

In short, the novel concept of the present invention involves the use of a layer with high hardness, deposited by CVD onto a sliding element whose properties, unexpectedly, do not allow the sliding element to wear an engine component with which the sliding element interacts, while the element itself does not wear either. And if wear occurs on both the sliding element itself and the other engine components, such wear will be relatively insignificant, particularly in the light of the wear undergone by the prior-art sliding elements.

By way of example, the prior-art sliding element may be a piston ring, a bearing, an engine cylinder or a valve. Considering that it is a piston ring, the advantages of the present invention are great. For instance, the piston ring provided with a deposited layer 4 of the present invention will not undergo so much wear, will not affect the longevity of its respective cylinder, and will not cause measurable wear on the piston groove where it is inserted.

On the one hand, it would be reasonable to think that the deposited layer 4 would guarantee good resistance to wear, but the prior art indicates that a layer with high hardness, such as that of the present invention, would delaminate and wear the other engine components with which it interacts.

Surprisingly, the unheard of application of the CVD-deposited layer 4 onto a sliding element has exceeded the expected results, and even with a layer having high hardness there is no wear on the components with which it interacts. There is even a decrease in wear of the sliding element itself and the advantage of standing higher loads without delamination.

Thus, the constructive configuration of the present invention has exceeded the initial expectation, fully justifying the novel sliding element 1. So, the excellent results achieved guarantee that the sliding element 1 with high hardness may exist and prolong the longevity of the components of internal combustion engines. The prolongation of the longevity of these components also results in prolongation of the useful life of the engine itself, including modern engines with considerably higher stresses. In this way, the result achieved by the sliding element 1 of the present invention is so superior to those of the prior art that it is viewed as a commercial success because one can predict not only the wear thereof, but also the wear on the other engine components with which it interacts. Thus, the present invention comprises not only the sliding element 1, but also an engine containing the sliding element 1 of the present invention.

Thus, the clear advantage of the sliding element 1 of the present invention is clear, wherein the combination of the chemical elements deposited in a specific manner has given rise to excellent results, which had not been achieved before.

A preferred example of embodiment having been described, one should understand that the scope of the present invention embraces other variations, being limited only by the contents of the accompanying claims, which include the possible equivalents.

The invention claimed is:

1. A sliding element for an internal combustion engine, comprising:
   a ferrous material base defining a plurality of surfaces;
   a binding nickel layer disposed on the plurality of the surfaces; and
   a deposited layer disposed on the binding nickel layer, wherein the deposited layer includes a metallic tungsten matrix material and a plurality of tungsten carbides distributed throughout the metallic tungsten matrix material, the deposited layer provided with a thickness between 5 and 150 microns;
   wherein the metallic tungsten matrix material having the plurality of tungsten carbides is directly adhered to the binding nickel layer.

2. The sliding element according to claim 1, wherein the deposited layer is deposited via chemical vapor deposition.

3. The sliding element according to claim 1, wherein the deposited layer has a hardness ranging from 1000 HV to 3500 HV.

4. The sliding element according to claim 3, wherein the hardness varies according to a layer depth of the deposited layer.

5. The sliding element according to claim 3, wherein the hardness of the deposited layer varies from an outer portion of the metallic tungsten matrix material arranged away from the ferrous material base to a middle region between 1500

HV to 3500 HV, and the hardness of the deposited layer from the middle region to an inner portion of the metallic tungsten matrix material opposite the outer portion is lower than 1500 HV.

6. The sliding element according to claim 1, wherein the plurality of tungsten carbides includes at least one of the following tungsten carbides: a carbide of WC tungsten, a subcarbide of W2C tungsten, a subcarbide of W3C tungsten, and a subcarbide of W12C tungsten.

7. The sliding element according to claim 1, wherein the deposited layer is applied only onto a sliding surface and adjacent surfaces of the ferrous material base.

8. The sliding element according to claim 7, wherein the deposited layer applied to the adjacent surfaces includes a thickness of no more than 70% of a thickness of the deposited layer applied to the sliding surface.

9. The sliding element according to claim 1, wherein the deposited layer is applied only to a sliding surface of the plurality of surfaces defined by the ferrous material base.

10. The sliding element according to claim 1, wherein the sliding element is a piston ring, a bearing, an engine cylinder or a valve.

11. An internal combustion engine comprising: a sliding element including:
    a ferrous material base defining a sliding surface;
    a binding nickel layer disposed on the base;
    a deposited layer overlaying the nickel layer and covering the sliding surface of the base, the deposited layer composed of a metallic tungsten matrix and a tungsten carbide contained in the metallic tungsten matrix, wherein the deposited layer includes a thickness between 5 and 150 microns and a hardness ranging from 1000 HV to 3500 HV; and
    wherein the hardness of the deposited layer varies according to a depth of the metallic tungsten matrix.

12. The engine according to claim 11, wherein the deposited layer is a chemical vapor deposition coating.

13. The engine according to claim 11, wherein the deposited layer along the depth of the metallic tungsten matrix defines an inner portion and an outer portion arranged away from the base in relation to the inner portion, wherein the hardness of the inner portion is lower than 1500 HV and the hardness of the outer portion ranges from 1500 HV to 3500 HV.

14. The engine according to claim 11, wherein the metallic tungsten matrix containing the tungsten carbide of the deposited layer is directly adhered to the binding nickel layer.

15. The engine according to claim 11, wherein the tungsten carbide includes at least one of a carbide of WC tungsten, a subcarbide of W2C tungsten, a subcarbide of W3C tungsten, and a subcarbide of W12C tungsten.

16. The sliding element according to claim 1, wherein the thickness of the deposited layer ranges between 5 and 60 microns.

17. The sliding element according to claim 1, wherein the deposited layer includes a hardness ranging from 1250 HV to 2000 HV.

18. The sliding element according to claim 1, wherein the binding nickel layer is composed of pure nickel.

19. A piston ring for internal combustion engines, comprising:
    a ferrous material base defining a plurality of surfaces, the plurality of surfaces including at least one surface extending transversely between at least two surfaces of the plurality of surfaces;
    a chemical vapor deposited layer uniformly distributed over all of the plurality of surfaces of the base and having a thickness ranging between 5 and 60 microns, the chemical vapor deposited layer being composed of a metallic tungsten matrix and a tungsten carbide;
    wherein the chemical vapor deposited layer has a hardness ranging from 1000 HV to 3500 HV.

20. The piston ring according to claim 19, further comprising a binding nickel layer disposed between the plurality of surfaces of the ferrous material base and the chemical vapor deposited layer, wherein the chemical vapor deposited layer is directly adhered to the binding nickel layer.

* * * * *